(12) United States Patent
Sewell

(10) Patent No.: US 8,054,449 B2
(45) Date of Patent: Nov. 8, 2011

(54) ENHANCING THE IMAGE CONTRAST OF A HIGH RESOLUTION EXPOSURE TOOL

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 431 days.

(21) Appl. No.: 11/603,243

(22) Filed: Nov. 22, 2006

(65) Prior Publication Data

US 2008/0117399 A1 May 22, 2008

(51) Int. Cl.
*G03B 27/42* (2006.01)
(52) U.S. Cl. .............................. 355/53; 355/67; 355/55
(58) Field of Classification Search .................... 355/67, 355/77, 30, 53, 55; 33/67, 77
See application file for complete search history.

(56) References Cited

U.S. PATENT DOCUMENTS

| | | | |
|---|---|---|---|
| 5,208,629 A | 5/1993 | Matsuo et al. | |
| 5,229,872 A | 7/1993 | Mumola | |
| 5,296,891 A | 3/1994 | Vogt et al. | |
| 5,440,426 A | 8/1995 | Sandstrom | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,621,498 A | 4/1997 | Inoue et al. | |
| 5,627,626 A | 5/1997 | Inoue et al. | |
| 5,677,703 A | 10/1997 | Bhuva et al. | |
| 5,707,501 A | 1/1998 | Inoue et al. | |
| 5,757,470 A * | 5/1998 | Dewa et al. ...................... 355/67 |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2002/0008863 A1* | 1/2002 | Taniguchi et al. ............... 355/55 |
| 2003/0035089 A1* | 2/2003 | Chandhok et al. .............. 355/53 |
| 2003/0215616 A1* | 11/2003 | Pierrat ........................ 428/195.1 |
| 2004/0041104 A1 | 3/2004 | Liebregts et al. | |

(Continued)

FOREIGN PATENT DOCUMENTS

EP  0 507 487 A2  10/1992

(Continued)

OTHER PUBLICATIONS

Notice of Reasons for Rejection mailed Aug. 3, 2010 for Japanese Patent Application No. 2007-296176, 4 pgs.

*Primary Examiner* — Edward J Glick
*Assistant Examiner* — Mesfin T Asfaw
(74) *Attorney, Agent, or Firm* — Sterne, Kessler, Goldstein & Fox P.L.L.C.

(57) ABSTRACT

A system and method are utilized to equalize intensity or energy in various diffraction order portions of a patterned beam. The patterned beam is formed using a diffractive patterning device. An attenuator is placed at a pupil of a projection system to attenuate respective diffraction order portions of the patterned beam. The projection device is also used to project the patterned beam onto a target portion of a substrate, after the respective attenuations.

20 Claims, 11 Drawing Sheets

U.S. PATENT DOCUMENTS

| | | |
|---|---|---|
| 2004/0130561 A1 | 7/2004 | Jain |
| 2005/0007572 A1 | 1/2005 | George et al. |
| 2006/0033900 A1* | 2/2006 | Saitoh et al. .................... 355/53 |

FOREIGN PATENT DOCUMENTS

| | | |
|---|---|---|
| EP | 0 562 133 B1 | 2/1998 |
| JP | 5-041345 A | 2/1993 |
| JP | 5-326370 A | 12/1993 |
| JP | 6-043393 A | 2/1994 |
| JP | 6-181159 A | 6/1994 |
| JP | 7-301908 A | 11/1995 |
| JP | 8-083761 A | 3/1996 |
| WO | WO 98/33096 A1 | 7/1998 |
| WO | WO 98/38597 A2 | 9/1998 |
| WO | WO 98/38597 A3 | 9/1998 |

* cited by examiner

ENHANCING THE IMAGE CONTRAST OF A HIGH RESOLUTION EXPOSURE TOOL

BACKGROUND

1. Field of the Invention

The present invention relates to a lithography apparatus and device manufacturing method.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In order to increase resolution limits of a lithography apparatus, while deceasing feature size, a patterning device can be used that diffracts the illumination beam to produce multiple diffraction order portions of the patterned beam of illumination. The diffraction order portions of the patterned beam interfere or combine with each other to form a final patterning beam that is projected onto the substrate. Based on an illumination mode, e.g., dipole, quadrapole, hexapole, octopole, annular, etc., and the type of patterning device being used, e.g., binary, attenuating phase shift, phase shift, alternating phase shift, the different diffraction order portions of the patterned beam will have different intensities or energies.

For example, when using dipole illumination and a binary patterning device, zero diffraction order portions of the patterned beam have significantly more energy than the first and higher diffraction order portions of the patterned beam. When the projection system combines (interferes) these different diffraction order portions of the patterned beam having the different intensities or energies, the combined patterned beam can exhibit an image contrast that is below an acceptable level. This can be caused by superfluous light that is not properly interfering in the combined patterned beam. The reduction in image contrast can result in less line width control and lower quality of a printed feature. In some cases, the low image contrast can result in features that are inoperable.

Therefore, what is needed is a system and method that increase image contrast.

SUMMARY

In one embodiment of the present invention, there is provided a system comprising an illumination system, a binary patterning device, and a projection system. The illumination system is configured to produce a beam of radiation having a non-annular illumination mode. The binary patterning device is configured to pattern the beam. The projection system is configured to project the patterned beam onto a target portion of a substrate. The projection system includes a ring-shaped attenuator positioned at an edge of a pupil of the projection system to attenuate zero diffraction order portions of the patterned beam. The attenuator is configured such that intensity of the zero and higher diffraction order portions of the patterned beam are substantially equalized.

In another embodiment, there is provided a system comprising an illumination system, a phase shift patterning device, and a projection system. The illumination system is configured to produce a beam of radiation having a non-annular illumination mode. The phase shift patterning device is configured to pattern the beam. The projection system is configured to project the patterned beam onto a target portion of a substrate. The projection system includes a ring-shaped attenuator positioned in a pupil of the projection system to a attenuate first diffraction order portion of the patterned beam. The attenuator is configured such that intensity of the first and higher diffraction order portions of the patterned beam are substantially equalized to a zero diffraction order portion of the patterned beam.

In another embodiment, there is provided a device manufacturing method comprising the following steps. Illuminating a binary patterning device using at least an off axis portion of a beam of radiation. Attenuating a zero diffraction order portion of the patterned beam at an annular peripheral edge of a pupil of a projection system, whereby intensity of the zero and higher diffraction order portions of the patterned beam are substantially equalized through the attenuating. Projecting the respective attenuated zero and higher diffraction order portions of the patterned beam onto a target portion of a substrate using the projection system.

Further embodiments, features, and advantages of the present invention, as well as the structure and operation of the various embodiments of the present invention, are described in detail below with reference to the accompanying drawings.

DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
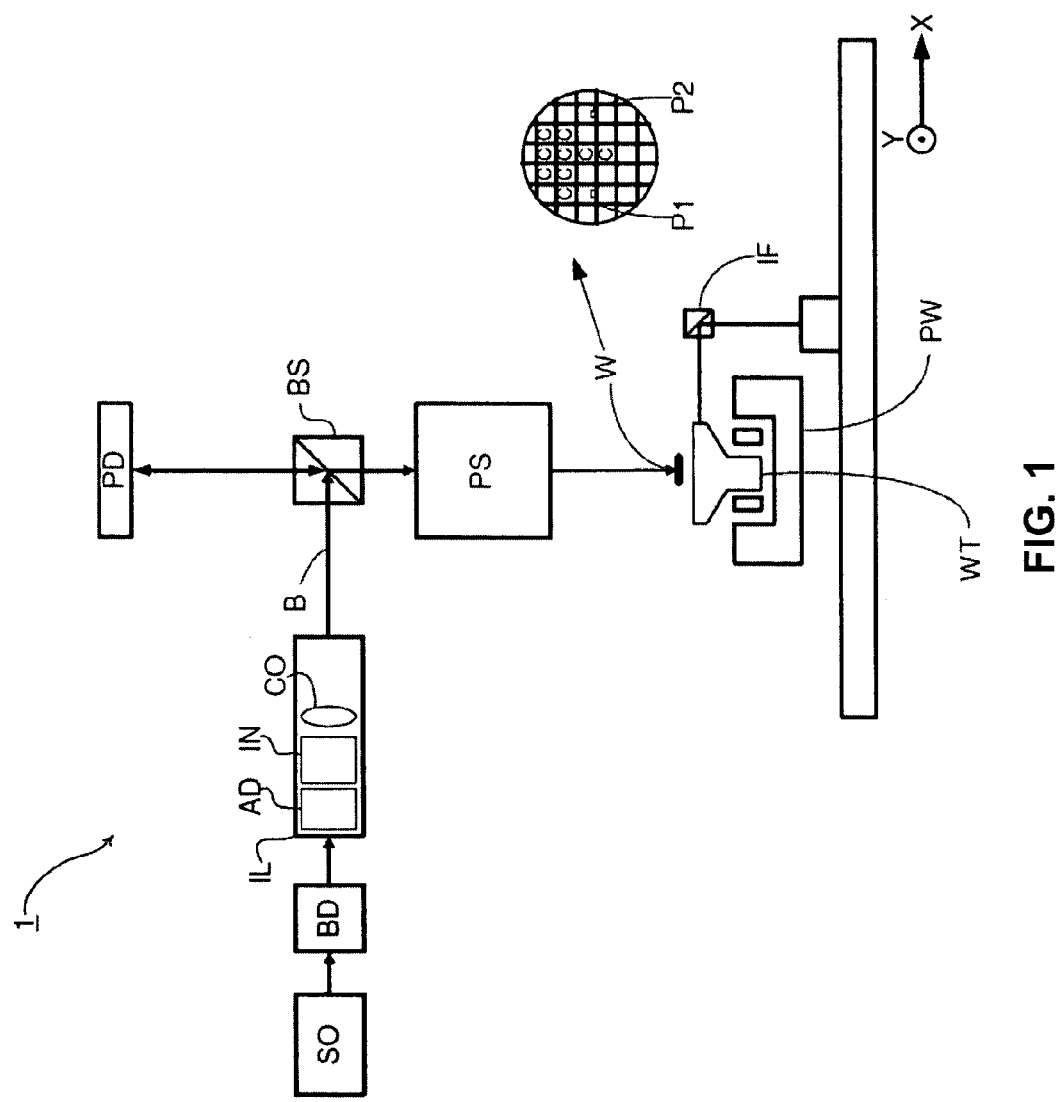
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In various examples, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In one example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. The thickness of the substrate may be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
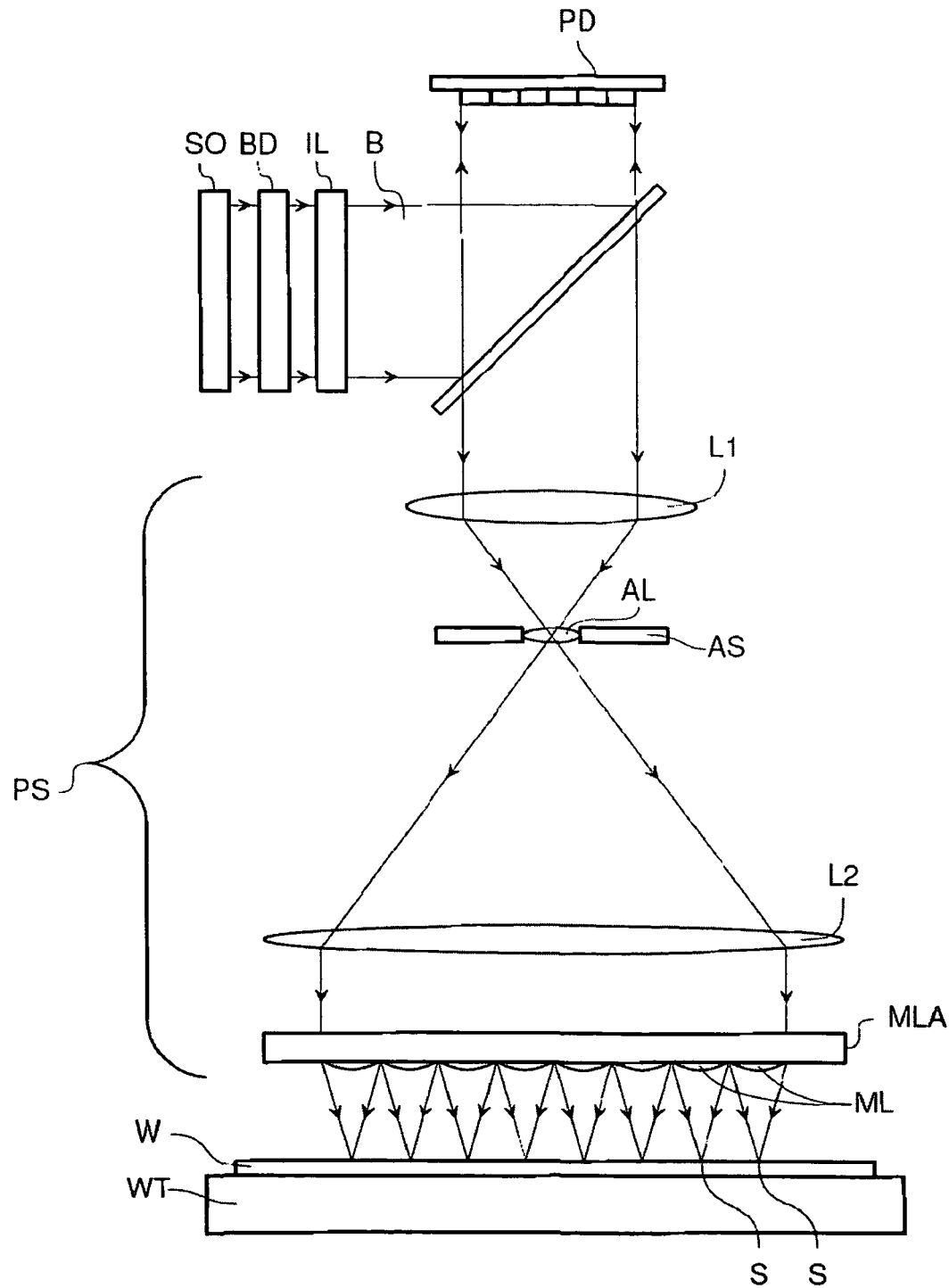

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 5:
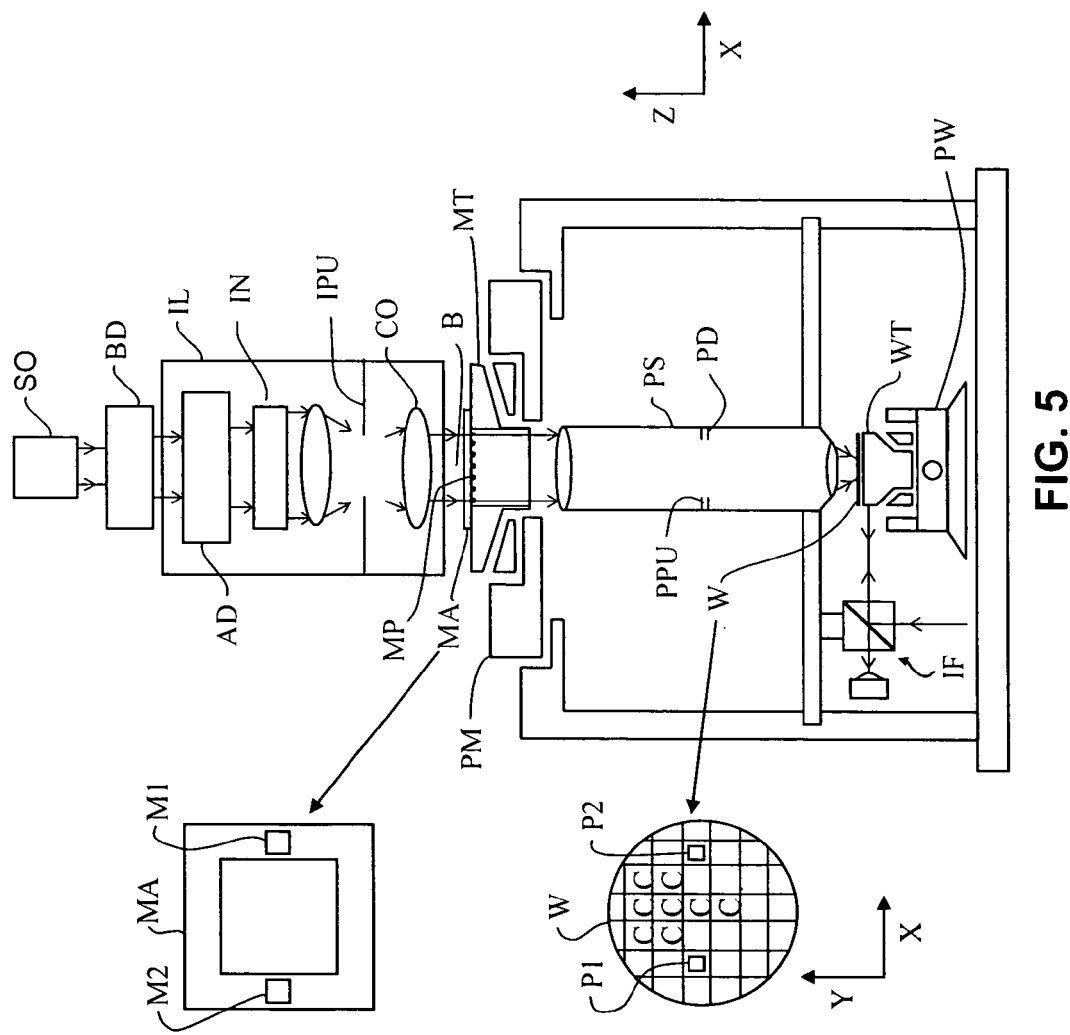
FIG. 5 shows an alternative lithographic apparatus.

FIG. 5 depicts a lithographic apparatus according to another embodiment of the present invention. Similar to FIGS. 1 and 2 above, the apparatus of FIG. 5 comprises an illumination system IL, a support structure MT, a substrate table WT, and a projection system.

The illumination system IL is configured to condition a radiation beam B (e.g., a beam of UV radiation as provided by a mercury arc lamp, or a beam of DUV radiation generated by a KrF excimer laser or an ArF excimer laser).

The support structure (e.g., a mask table) MT is constructed to support a patterning device (e.g., a mask) MA having a mask pattern MP and connected to a first positioner PM configured to accurately position the patterning device in accordance with certain parameters.

The substrate table (e.g., a wafer table) WT is constructed to hold a substrate (e.g., a resist-coated wafer) W and connected to a second positioner PW configured to accurately position the substrate in accordance with certain parameters.

The projection system (e.g., a refractive projection lens system) PS configured to project a pattern imparted to the radiation beam B by the pattern MP of the patterning device MA onto a target portion C (e.g., comprising one or more dies) of the substrate W.

The illumination system IL may include various types of optical components, such as refractive, reflective, and diffractive types of optical components, or any combination thereof, for directing, shaping, or controlling radiation.

The support structure MT supports, i.e., bears the weight of, the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT may be a frame or a table, for example, which may be fixed or movable as required. The support structure MT may ensure that the patterning device MA is at a desired position, for example with respect to the projection system PA. Any use of the terms "reticle" or "mask" herein may be considered synonymous with the more general term "patterning device."

As noted above, the term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern MP includes phase-shifting features or so called assist features. Generally, the pattern imparted to the radiation beam B will correspond to a particular functional layer in a device being created in the target portion C, such as an integrated circuit.

Referring to FIG. 5, the illumination system IL receives a radiation beam from a radiation source SO, such as for example a mercury-arc lamp for providing g-line or i-line UV radiation, or an excimer laser for providing DUV radiation of a wavelength of less than about 270 nm, such as for example 248, 193, 157, and 126 nm. The source SO and the lithographic apparatus may be separate entities, for example when the source SO is an excimer laser. In such cases, the radiation beam B is passed from the source SO to the illumination system IL with the aid of a beam delivery system BD comprising, for example, suitable directing mirrors and/or a beam expander. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may comprise an adjuster AD for adjusting the angular intensity distribution of the radiation beam B at mask level. Generally, at least the outer and/or inner radial extent (commonly referred to as σ-outer and σ-inner, respectively) of the intensity distribution in a pupil IPU of the illumination system IL can be adjusted. In addition, the illumination system IL may comprise various other components, such as an integrator IN and a condenser CO. The illumination system IL may be used to condition the radiation beam B, to have a desired uniformity and intensity distribution in its cross-section at mask level.

The radiation beam B is incident on the patterning device (e.g., mask MA), which is held on the support structure (e.g., mask table MT), and is patterned by the patterning device MA in accordance with a pattern MP. Having traversed the mask MA, the radiation beam B passes through the projection system PS, which focuses the beam B onto a target portion C of the substrate W.

The projection system has a pupil PPU conjugate to the illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 5) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks P1, P2 as illustrated occupy dedicated target portions, they may be located in spaces between target portions (these are known as scribe-lane alignment marks). Similarly, in situations in which more than one die is provided on the mask MA, the mask alignment marks M1 and M2 may be located between the dies.

The depicted apparatus of FIG. 5 could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIGS. 1 and 5 are depicted with the same reference numerals. Also, the above descriptions of the various embodiments, e.g., the various configurations of the substrate, the patterning device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
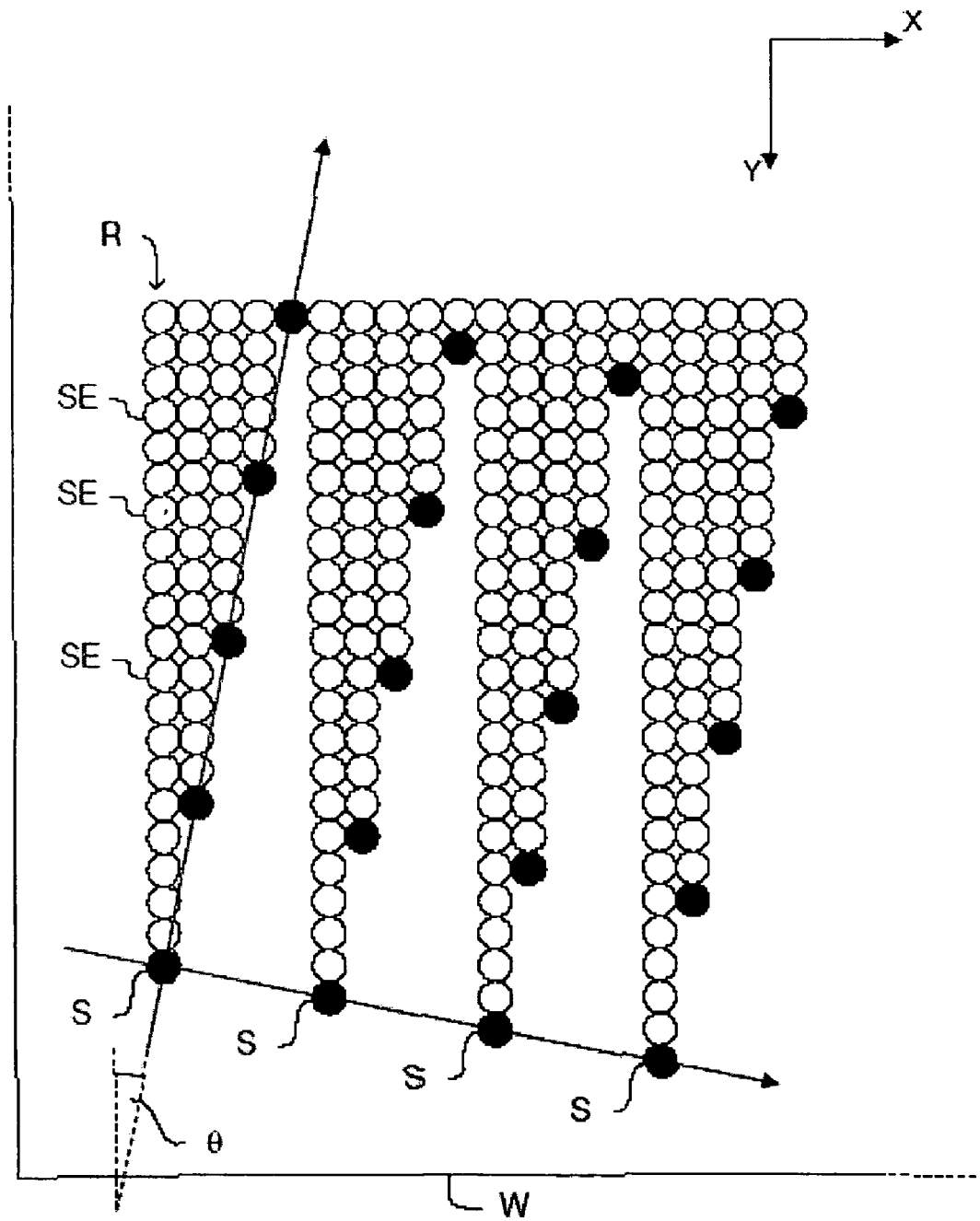
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S.

Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
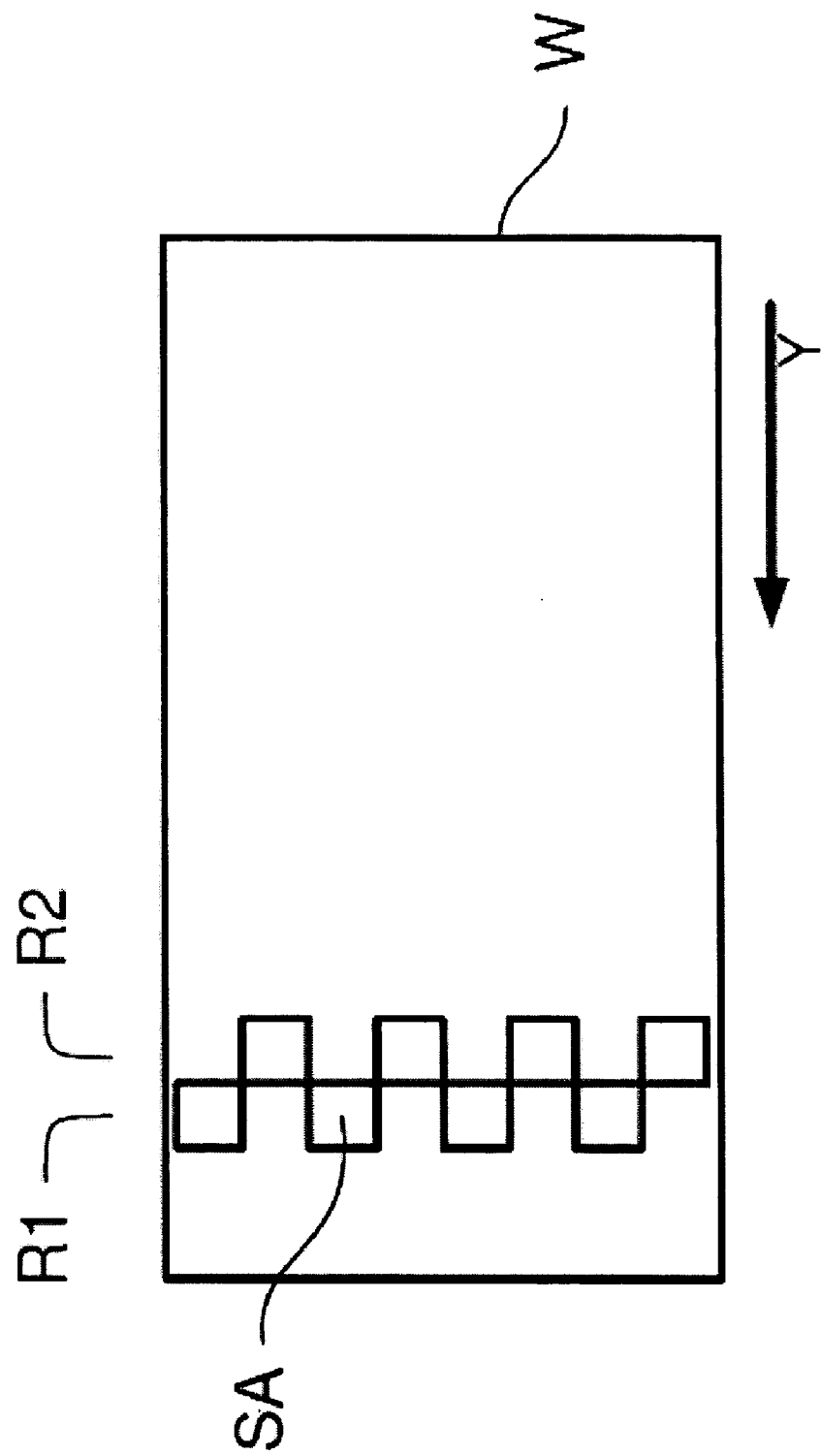
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 6:
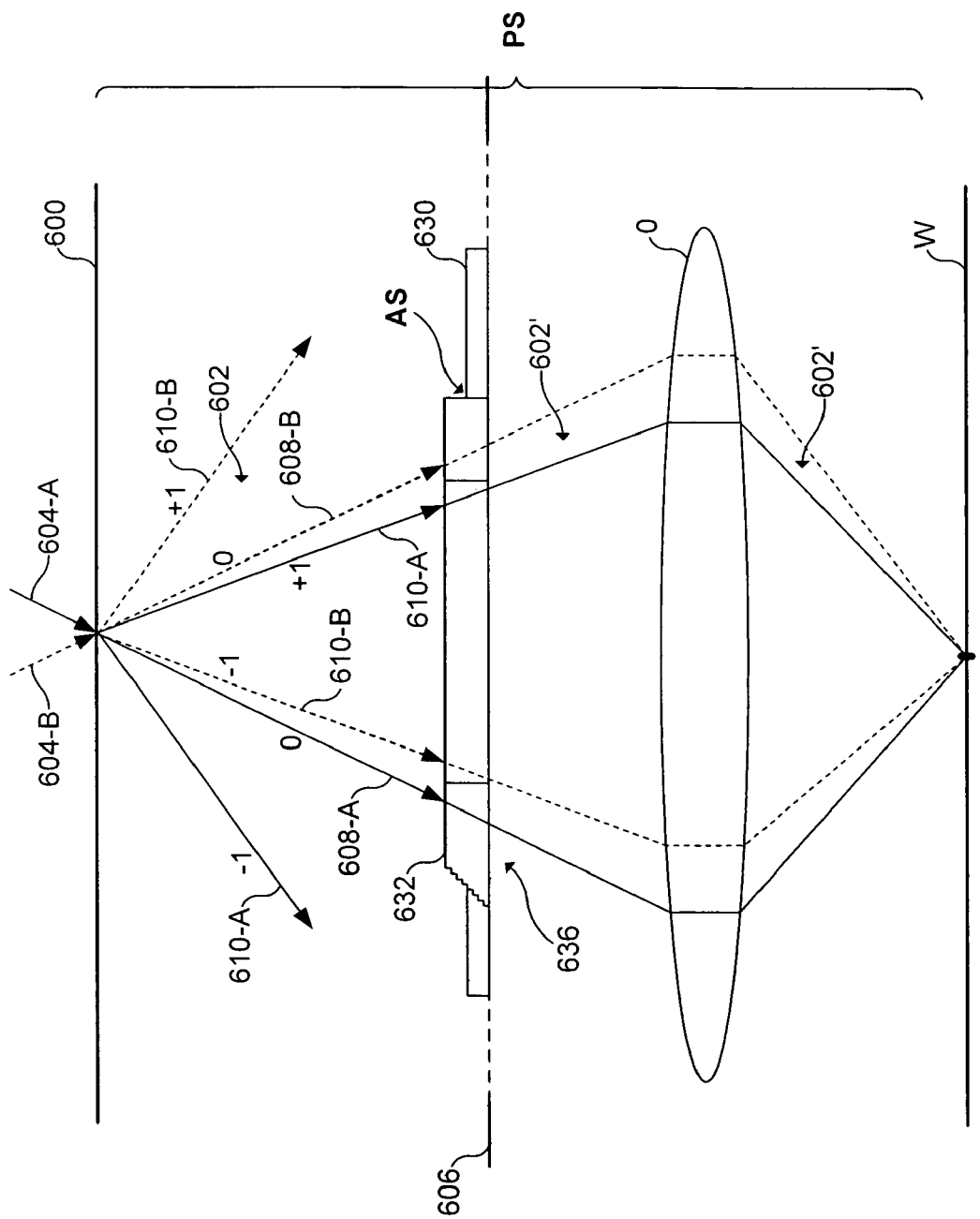
FIG. 6 shows a portion of a lithographic apparatus.

FIG. 6 shows a portion of a lithographic apparatus, for example a portion of one of the lithographic apparatus found in FIG. 1, 2, or 5. The portion of the lithographic apparatus comprises a diffractive patterning device 600, a projection system PS including an attenuator 630, an aperture stop AS, and an optical device O, and a substrate W. Diffractive patterning device 600 produces a patterned beam 602 from dipole illumination 604. It is to be appreciated that other illumination modes for beam 604 could also be used without departing from the scope of the present invention, for example the other illumination modes described above. Patterned beam 602 is received at attenuator 630 positioned along a projection system pupil 606 (see also pupil PPU in FIG. 5).

When using dipole illumination 604, the two parts 604-A and 604-B (shown as solid and dashed lines, respectively) of dipole illumination 604 impinge on diffractive patterning device 600. Diffractive patterning device 600 forms zero (0) diffraction order portions 608-A and 608-B, +/− first (1st) diffraction order portions 610-A and 610-B, and +/− higher diffraction order portions (not shown). In the example shown, zero diffraction order portions 608-A and 608-B of patterned beam 602 are attenuated by an attenuation area 632 (e.g., an attenuation ring) of attenuator 630, while a first portion of first diffraction order portions 610-A and 610-B of patterned beam 602-A and 602-B pass through an opening, e.g., aperture stop AS, in attenuator 630 without being attenuated. A second portion of first diffraction order beams 610-A and 610-B do not pass through the pupil 606. This interaction of patterned beam 602 with attenuator 630 forms partially attenuated patterned beam 602'. The attenuated zero order portions 608' (A and B are not shown) and first diffraction order portions 610 (A and B are not shown) (the partially attenuated patterned beam 602') are received at optical element O. Optical element O directs partially attenuated patterned beam 602' onto a target portion of substrate W.

As is seen, zero diffraction order portion 608-A of pattered beam 602-A and one portion of first diffraction order beam 610-A of first dipole 604-A are directed to opposite sides of pupil 606. Similarly, zero diffraction order portion 608-B of patterned beam 602-B and one portion of first diffraction order beam 610-B of second dipole 604-B are directed to opposite sides of pupil 606. This allows for zero diffraction order portion 608-A of patterned beam 602-A to be adjacent to the one portion of first diffraction order beam 610-B, and vice versa. It is to be appreciated the spacing between the zero and first diffraction order portions of the patterned beam in this figure is for illustrative purposes, and may not be to scale. Also, the zero and first diffraction order portions of the patterned beam being adjacent is typically true only for maximum resolution situations. Otherwise, if the resolution changes, the angles of the beams change, and the zero and first diffraction order portions of the patterned beam may no longer be adjacent.

In one example, pupil 606 of the projection system PS can include an optical element, e.g., a lens or the like (see FIG. 9 and discussion below).

Diffractive patterning device 600 can be used as patterning device PD in FIG. 1 or 2 or mask MA in FIG. 6. Thus, diffractive patterning device 600 can be a dynamic or static patterning device, as discussed in more detail above. Depending on a type of diffractive patterning device 600 being used, each diffraction order portion of the patterned beam 602 may have a different intensity or energy as it reaches its corresponding position of pupil 606. For example, when a binary patterning device is used for diffractive patterning device 600, zero diffraction order portion 608 of patterned beam 602 has the highest energy, followed by first diffraction order portion 610 of patterned beam 602, and so on for the other higher diffraction order portions. Alternatively, when a phase shift patterning device is used for diffractive patterning device 600, first diffraction order portion 610 of patterned beam 602, and higher diffraction order portions, have more energy than zero diffraction order portions 608 of patterned beam 602. However, it is desirable that all orders of patterned beam 602 have a substantially equal intensity.

Through this attenuation scheme, resolution of patterned beam 602 is increased in partially attenuated patterned beam 602'. This is because first and higher order diffraction order portions with a larger angle to zero diffraction order portions 608 will pass through aperture stop AS, while zero diffraction order portions 608 pass near an edge 636, which substantially equalizes their energies.

Figure 7:
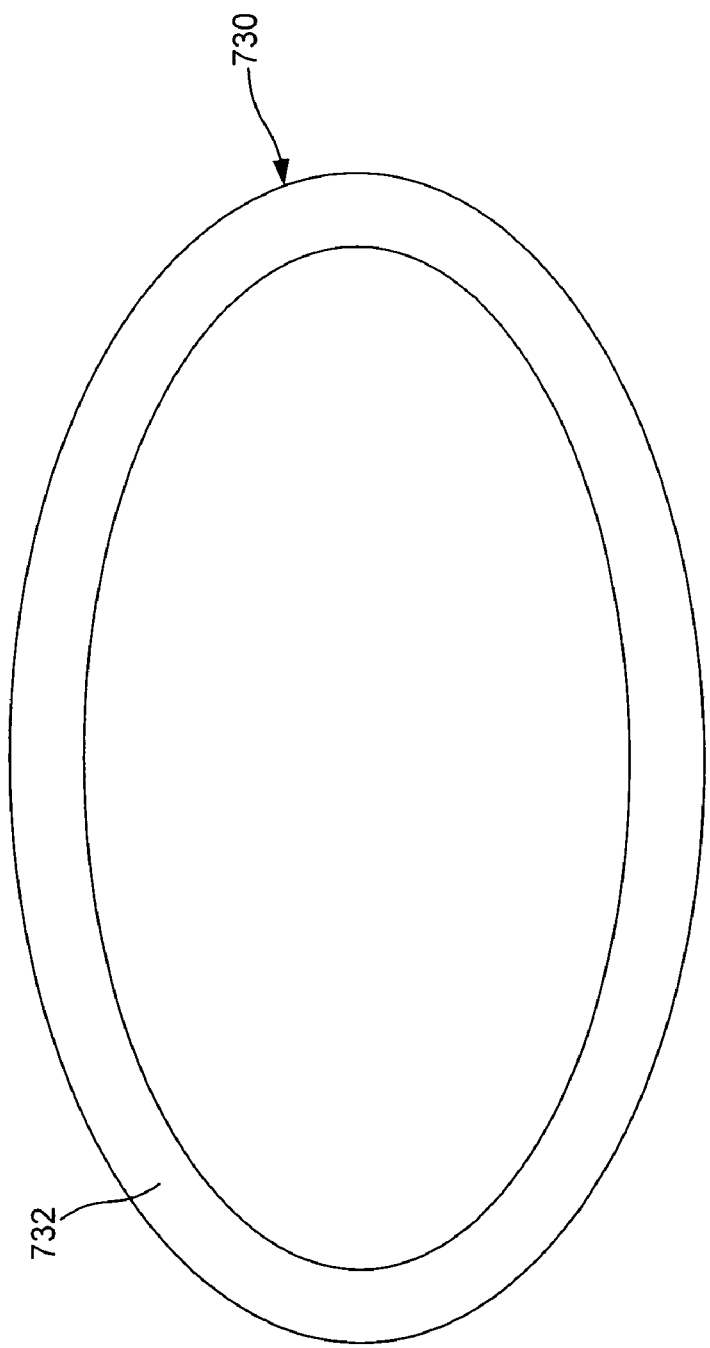
FIGS. 7 and 8 show configurations of various attenuators.
Figure 8:
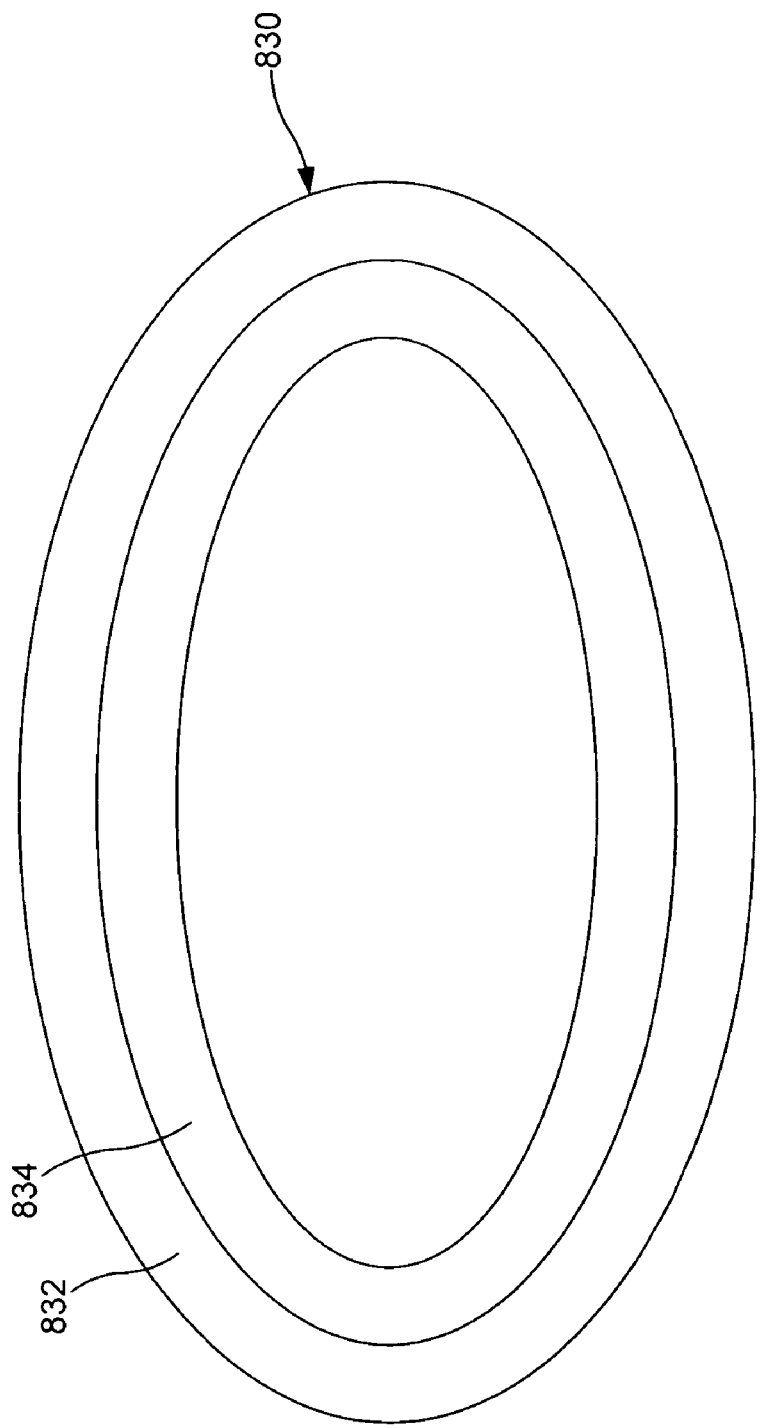

FIGS. 7 and 8 show alternative configurations of various attenuators 730 and 830. Attenuators 730 and 830 can be, alternatively, stand alone elements or formed on optical elements already used within the projection system PS. As discussed above, attenuators 730 and 830 are used to substantially equalize intensities of different diffraction order portions of patterned beam 602. Nickel or chromium material, for example, can be used for the absorbing material on the attenuators 730 and 830.

Referring again to FIG. 7, attenuator 730 is configured to be used when illumination beam 604 is dipole illumination and diffraction patterning device 600 is a binary patterning device. In this configuration, as described above, zero diffraction order portion 608 of patterned beam 602 has more energy than first diffraction order portion 610 of patterned beam 602. Thus, attenuator 730 includes an attenuation area 732 that reduces the energy in zero diffraction order portion 608, such that the energy is substantially equal to first diffraction order portion 610.

Referring now to FIG. 8, alternative attenuator 830 is configured to be used when illumination beam 604 is dipole illumination and diffraction patterning device 600 is a phase shift patterning device (e.g., an attenuating phase shift patterning device). In this configuration, as described above, zero diffraction order portion 608 has less energy than first diffraction order portion 610. Thus, attenuator 830 has an area 834 that reduces the energy in first diffraction order portion 610, such that the energy is substantially equal to zero diffraction order portion 608.

Additionally, or alternatively, attenuator 830 can have a transparent (with respect to the wavelength of light of beam 604) or less attenuating area 832 (with respect to the attenuation of area 834) corresponding to zero diffraction order portion 608. This can be done in order to control attenuation of first diffraction order portion 608, while also controlling attenuation of first diffraction order portion 610.

Additionally, or alternatively, attenuators 730 and 830 can have graduated attenuation areas or rings (not shown). Each graduated area has an attenuation amount that either increases or decreases when moving further out on the diameter of the attenuator. In this way, each diffraction order portion can be individually and separately attenuated instead of only attenuating a single diffraction order portion. Also, when using this configuration, a zero diffraction order portion can be directed to a portion of the attenuator having a desired attenuation. For example, if 70% attenuation is desired, the zero diffraction order portion can be directed by the illumination system IL (not shown, see FIGS. 1, 2, and 5) towards the band of the attenuator corresponding to this attenuation instead of a band of the attenuator having, e.g., 65% or 75% attenuation.

Additionally, or alternatively, attenuators 730 and 830 can be configured to induce a known phase change in patterned beam 602. This phase change can be compensated for, for example, through a compensating system. The compensating system may be a compensating arrangement of the optical devices in the projection system PS of FIG. 1, 2, 5, or 6. For example, spacing between and/or orientation of the optical devices in the projection system PS can be configured to compensate for a known phase change produced by attenuator 730 or 830.

Figure 9:
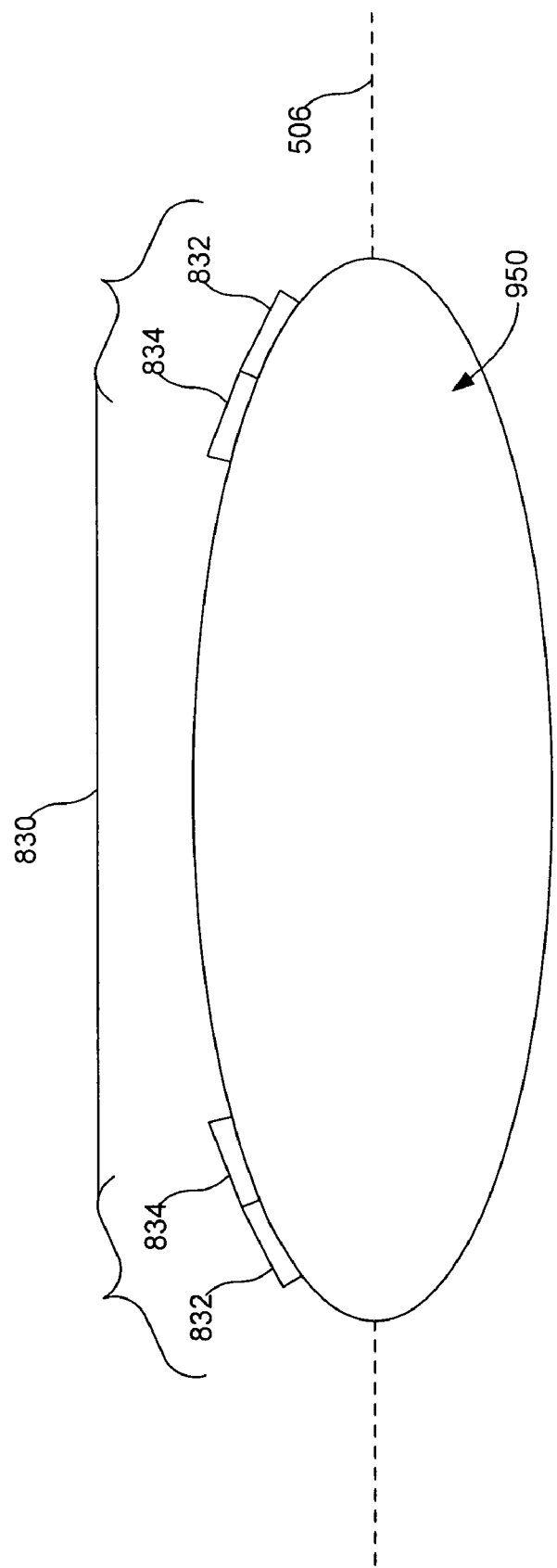
FIG. 9 shows an optical element including an attenuating portion.

FIG. 9 shows an alternative arrangement in which an optical element 960, which includes an attenuating portion 832 and/or 834, is positioned at pupil 606. Attenuator 830 is used for illustration, not a limitation. Attenuator 830 can be formed on optical element 960 using an absorbing medium formed on optical element 960. For example, a nickel or chromium material can be used for the absorbing material. In one example, a 60 Å layer of absorbing material (used for 832 and/or 834) can be formed on a quartz optical element 960.

Figure 10:
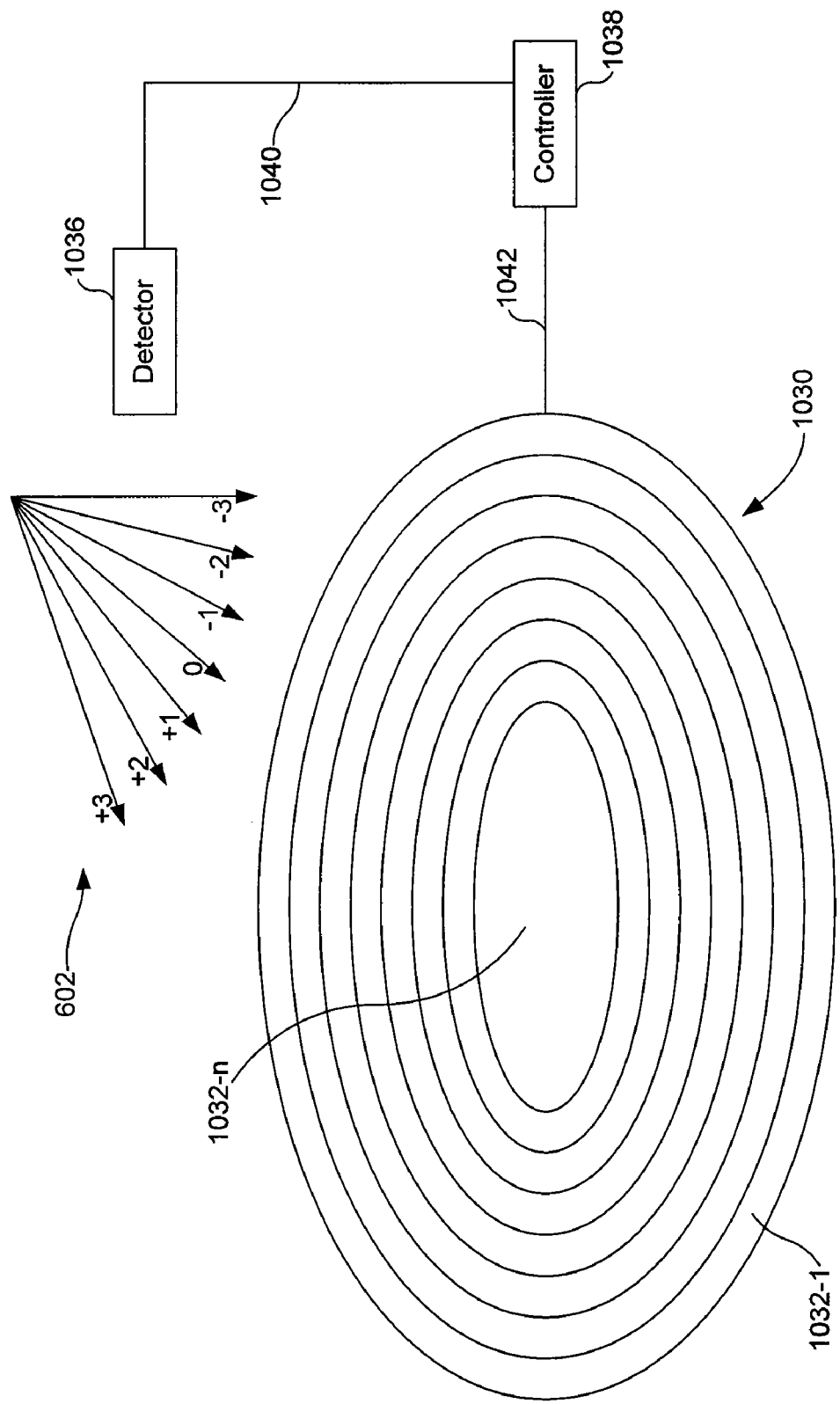
FIG. 10 shows a variable attenuator.

FIG. 10 shows a variable attenuator or a dynamic attenuating device 1030 (e.g., an LCD device, a electro-optical modulator, or the like). Variable attenuator 1030 has one or more attenuating portions 1032-1 to 1032-n (n being an integer greater than 1), which may be placed at pupil 606. In this case, a detector or sensor 1036 and controller 1038 may be used to determine how much attenuation is needed for each of the one or more diffraction order portions of patterned beam 602 to substantially equalize energy in the respective one or more diffraction order portions. A signal 1040 representative of the different energy levels is transmitted from detector 1036 to controller 1038. Controller 1038 generates and transmits a control signal 1042 to dynamic attenuating device 1030 to adjust the one or more attenuation areas 1032 for proper attenuation of the respective diffraction order portions of patterned beam 602. This can be done, for example, either during calibration, periodically, or continually in real time.

Again, through using attenuators 730, 830, or 1030, each diffraction order portion of patterned light 602 being projected from the projection system PS onto substrate W (see FIGS. 1, 2, and 12) has substantially equal intensity.

Figure 11:
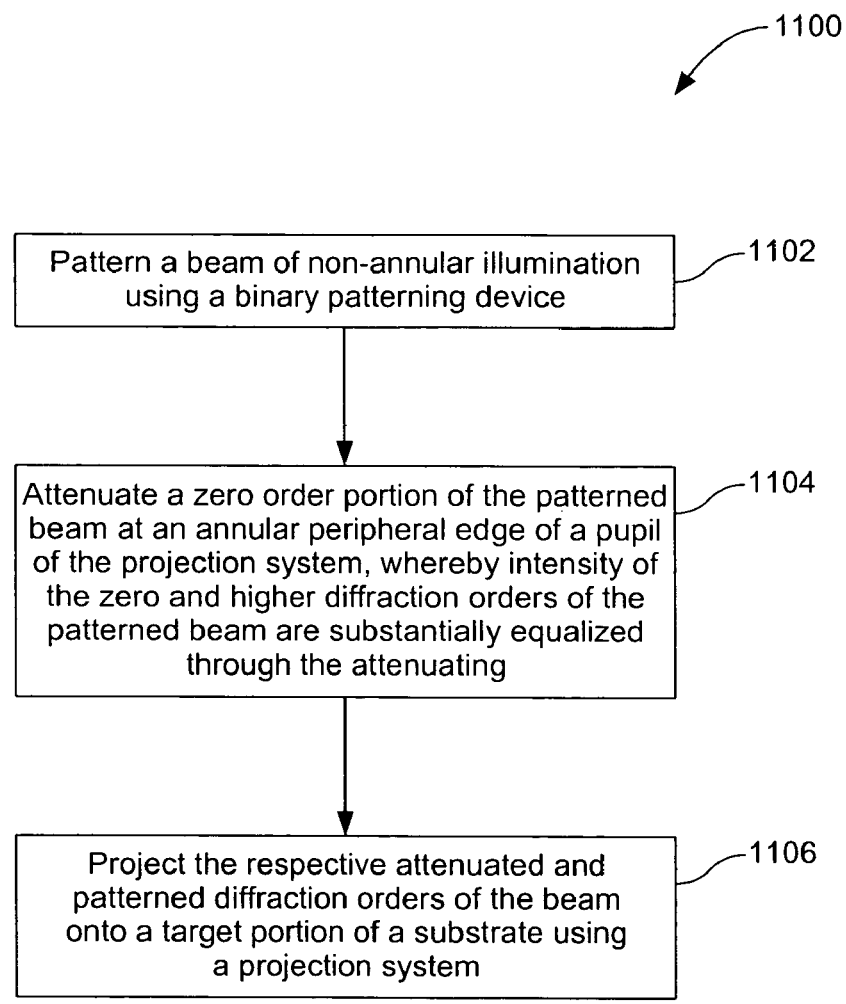
FIG. 11 is a flowchart depicting a method.

FIG. 11 is a flowchart depicting a method 1100. For example, method 1100 can be performed using any one of the systems or devices described above. At step 1102, a beam of non-annular illumination is patterned using a binary patterning device. At step 1104, a zero order portion of the patterned beam is attenuated at an annular peripheral edge of a pupil of the projection system. Intensity of the zero and higher diffraction order portions of the patterned beam are substantially equalized through the attenuating. At step 1106, the respective attenuated and patterned diffraction order portions of the beam are projected onto a target portion of a substrate using a projection system.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method; comprising:
illuminating a binary patterning device using an off axis portion of a beam of radiation to form a patterned beam;
attenuating each diffraction order portion of the patterned beam individually and separately at various ring-shaped graduated attenuation areas of an attenuator positioned at a pupil of a projection system, in a manner such that intensities of the zero diffraction order portion of the patterned beam, and higher diffraction order portions of the patterned beam transmitted through the attenuator, are substantially equalized through the attenuating; and
projecting the zero and higher diffraction order portions of the patterned beam, having been intensity equalized, onto a target portion of a substrate using the projection system.

2. The method of claim 1, wherein the attenuating comprises using an attenuating ring or an annular-shaped filter to perform the attenuating without a phase shift.

3. The method of claim 1, wherein the attenuating comprises attenuating using an attenuating ring or an annular-shaped filter on an optical element positioned in the pupil of the projection system.

4. The method of claim 3, wherein the optical element comprises a lens.

5. The method of claim 3, wherein the attenuating annular-shaped filter has attenuation bands each causing a different amount of attenuation, such that, depending on a desired attenuation amount of the zero order portion, an illumination system that produces a non-annular illumination, directs the zero order portion to impinge on a corresponding one of the attenuation bands.

6. The method of claim 3, wherein the optical element is a quartz material.

7. The method of claim 1, wherein the attenuating is carried out by an attenuating ring or an annular-shaped filter on an object, the object being arranged to move into and out of the pupil of the projection system.

8. The method of claim 1, wherein:
the attenuating comprises using an attenuating ring or an annular-shaped filter to perform the attenuating and to produce a phase change in the patterned beam; and
the method further comprises compensating for the phase change produced in the attenuating.

9. The method of claim 1, wherein the beam of radiation has a non-annular illumination mode and the non-annular illumination mode of the beam of radiation is dipole, quadrapole, hexapole, or octopole.

10. A lithography system, comprising:
an illumination system configured to produce a beam of radiation having a non-annular illumination mode;
a binary patterning device configured to pattern the beam to form a patterned beam; and
a projection system configured to project the patterned beam onto a target portion of a substrate, the projection system including an attenuator having ring-shaped graduated attenuation areas positioned at a pupil of the projection system to attenuate each diffraction order portion of the patterned beam individually and separately, in a manner such that intensities of the zero diffraction order portion of the patterned beam, and higher diffraction order portions of the patterned beam transmitted through the attenuator, are substantially equalized.

11. The lithography system of claim 10, wherein the attenuator is arranged on an optical element of the projection system.

12. The lithography system of claim 10, wherein the attenuator is configured to be moved into and out of the pupil of the projection system.

13. The lithography system of claim 10, wherein the attenuator is configured to have attenuation bands each having different attenuation amounts, such that, depending on a desired attenuation amount of the zero diffraction order portion of the patterned beam, the illumination system directs the zero diffraction order portion of the patterned beam to impinge on a corresponding one of the attenuation bands.

14. The lithography system of claim 10, wherein the illumination system is configured to produce the non-annular illumination mode of the beam of radiation as dipole, quadrapole, hexapole, or octopole illumination.

15. The lithography system of claim 10, further comprising:

a detector configured to detect energy of each of the diffraction order portions of the patterned beam; and a controller configured to generate a control signal based on the detected energies, wherein the attenuator is a variable attenuator that is configured to vary at respective areas corresponding to the control signal.

16. The lithography system of claim 10, wherein:

the attenuator is configured to produce a phase change in the patterned beam as the patterned beam passes therethrough; and the projection system further comprises a phase change compensating system that compensates for the phase change in the patterned beam produced by the attenuator.

17. A lithography system, comprising:

an illumination system configured to produce a beam of radiation having a non-annular illumination mode;

a phase shift patterning device configured to pattern the beam to form a patterned beam;

a projection system configured to project the patterned beam onto a target portion of a substrate, the projection system including a ring-shaped attenuator positioned at an edge of a pupil of the projection system to attenuate a first diffraction order portion of the patterned beam, in a manner such that intensities of the first and higher diffraction order portions of the patterned beam are substantially equalized to that of a zero diffraction order portion of the patterned beam, wherein attenuation at a central part of the ring-shaped attenuator is substantially smaller than attenuation at the edge;

a detector configured to detect energy of each of the diffraction order portions of the patterned beam; and a controller configured to generate a control signal based on the detected energies, wherein the attenuator is a variable attenuator that is configured to vary at respective areas corresponding to the control signal.

18. The lithography system of claim 17, wherein the attenuator comprises:

a first attenuating ring configured to attenuate the zero diffraction order portion of the patterned beam; and a second attenuating ring configured to attenuate the first diffraction order portion of the patterned beam.

19. The lithography system of claim 17, wherein the phase shift patterning device is an attenuating phase shift patterning device.

20. The lithography system of claim 17, wherein:

the attenuator is configured to produce a phase change in the patterned beam as the patterned beam passes therethrough; and the projection system further comprises a phase change compensating system configured to compensate for the phase change in the patterned beam produced by the attenuator.

\* \* \* \* \*